United States Patent
Ohta et al.

(10) Patent No.: US 8,330,168 B2
(45) Date of Patent: Dec. 11, 2012

(54) NITRIDE SEMICONDUCTOR LIGHT-EMITTING ELEMENT AND METHOD OF MANUFACTURING THE SAME

(75) Inventors: Yutaka Ohta, Tokyo (JP); Yoshikazu Ooshika, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/143,874

(22) PCT Filed: Dec. 24, 2009

(86) PCT No.: PCT/JP2009/007214
§ 371 (c)(1), (2), (4) Date: Jul. 8, 2011

(87) PCT Pub. No.: WO2010/079567
PCT Pub. Date: Jul. 15, 2010

(65) Prior Publication Data
US 2011/0266553 A1   Nov. 3, 2011

(30) Foreign Application Priority Data

Jan. 9, 2009 (JP) ................................. 2009-003933

(51) Int. Cl.
*H01L 29/15* (2006.01)
(52) U.S. Cl. .................... 257/76; 257/E29.091
(58) Field of Classification Search .............. 438/22, 438/24, 25, 30, 46, 47, 105; 257/70–105, 257/E29.102, E33.037, E29.246, E29.089, 257/E29.09, E29.091
See application file for complete search history.

(56) References Cited

U.S. PATENT DOCUMENTS

2003/0087462 A1* 5/2003 Koide et al. ............... 438/22
2006/0006375 A1* 1/2006 Ou et al. .................... 257/14
2009/0057692 A1* 3/2009 Lee ............................ 257/89

FOREIGN PATENT DOCUMENTS

| JP | A-2002-141552 | 5/2002 |
| JP | A-2004-335559 | 11/2004 |
| JP | A-2006-066556 | 3/2006 |
| JP | A-2006-245162 | 9/2006 |
| JP | A-2006-295132 | 10/2006 |
| JP | A-2008-140917 | 6/2008 |
| JP | A-2008-171941 | 7/2008 |

OTHER PUBLICATIONS

Japanese Office Action issued in Application No. 2009-003933; Dated Aug. 23, 2011 (With Translation).
International Search Report issued in Application No. PCT/JP2009/007214; Dated Feb. 2, 2010 (With Translation).

* cited by examiner

*Primary Examiner* — Brook Kebede
(74) *Attorney, Agent, or Firm* — Oliff & Berridge, PLC

(57) ABSTRACT

An object of the present invention is to provide a nitride semiconductor light-emitting device in which contact resistance generated between an n-contact layer and an n-side electrode is effectively reduced while maintaining satisfactory external quantum efficiency, and a method of efficiently producing the nitride semiconductor light-emitting device. Specifically, the present invention characteristically provides a nitride semiconductor light-emitting device having a semiconductor laminated body including an n-type laminate, a light-emitting layer and a p-type laminate, and an n-side electrode and a p-side electrode, characterized in that: the n-type laminate includes an n-contact layer made of an $Al_xGa_{1-x}N$ material ($0.7 \leq x \leq 1.0$) and an n-clad layer provided on the n-contact layer; and an interlayer made of an $Al_yGa_{1-y}N$ material ($0 \leq y \leq 0.5$) is provided on a partially exposed portion, on the light-emitting layer side, of the n-contact layer.

6 Claims, 5 Drawing Sheets (a)

(b)

(a)

(b)

NITRIDE SEMICONDUCTOR LIGHT-EMITTING ELEMENT AND METHOD OF MANUFACTURING THE SAME

TECHNICAL FIELD

The present invention relates to a nitride semiconductor light-emitting device and a method of manufacturing the same.

PRIOR ART

Examples of the characteristics required of a light-emitting device include high external quantum efficiency properties and low resistance properties. A junction barrier is generally formed when a semiconductor is brought into contact with a metal. For example, relatively high contact resistance arises between a semiconductor and an electrode made of a metal material. In a so-called double heterostructure as a basic structure of a light-emitting device, in which both sides of a layer having a relatively narrow band gap (which layer is referred to as a light-emitting layer) is sandwiched between a p-type semiconductor layer and an n-type semiconductor layer each having a wide band gap (which layers are referred to as cladding layers), power loss is caused due to contact resistance arising between a laminate of semiconductor layers and a pair of electrodes mounted thereto when a voltage is applied between the pair of electrodes.

In order to reduce contact resistance arising between a semiconductor and an electrode, there is a widely known technique of preventing serious power loss from occurring between an electrode and a semiconductor layer by interposing a contact layer formed of a material having a relatively narrow band gap between the electrode and the semiconductor layer to decrease a barrier between the electrode and the semiconductor.

JP 2002-141552 and JP 2004-335559 disclose techniques of forming GaN layer and/or an AlGaN layer having Al composition ratio not higher than 30% as a contact layer. However, such a contact layer having relatively low Al content in composition thereof as described above causes a problem in that, when it is used for an UV light-emitting device having an emission wavelength of 300 nm or less, UV light generated in a light-emitting layer is absorbed by the contact layer and the external quantum efficiency is decreased, although the contact layer exhibits relatively low contact resistance with respect to an electrode.

In order to solve the aforementioned problem, JP 2006-295132 discloses a technique of suppressing reduction in external quantum efficiency by providing between a first light-emitting layer and a GaN contact layer a second light-emitting layer for absorbing UV light generated by the first light-emitting layer and emitting light having a longer wavelength than the absorbed light. However, there is a problem in this technique, in that a relatively large number of layers has to be formed, thereby increasing the production cost.

SUMMARY OF THE INVENTION

Problems to be Solved by the Invention

An object of the present invention is to provide a nitride semiconductor light-emitting device in which contact resistance generated between an n-contact layer and an n-side electrode is effectively reduced while maintaining satisfactory external quantum efficiency, and also provide a method for of efficiently producing the nitride semiconductor light-emitting device.

Means for Solving the Problem

The present invention primarily includes following components.

(1) A nitride semiconductor light-emitting device having a semiconductor laminated body including an n-type laminate, a light-emitting layer and a p-type laminate, and an n-side electrode and a p-side electrode, characterized in that: the n-type laminate includes an n-contact layer made of an $Al_xGa_{1-x}N$ material ($0.7 \leq x \leq 1.0$) and an n-clad layer provided on the n-contact layer; and an interlayer made of an $Al_yGa_{1-y}N$ material ($0 \leq y \leq 0.5$) is provided on a partially exposed portion, on the light-emitting layer side, of the n-contact layer.

(2) The nitride semiconductor light-emitting device of (1) above, further comprising an electron blocking layer between the light-emitting layer and the p-type laminate.

(3) The nitride semiconductor light-emitting device of (1) or (2) above, in which the resistance between the n-contact layer and the n-side electrode is equal to or less than 10Ω, and the external quantum efficiency is equal to or higher than 0.70%.

(4) A method of producing a nitride semiconductor light-emitting device, comprising the steps of: forming a semiconductor laminated body by sequentially growing on a substrate an n-type laminate including an n-contact layer and an n-clad layer, a light-emitting layer, and a p-type laminate including a p-clad layer and a p-contact layer in this order; forming an interlayer and an n-side electrode on the n-contact layer; and forming a p-side electrode on the p-contact layer, wherein the n-contact layer is formed of an $Al_xGa_{1-x}N$ material ($0.7 \leq x \leq 1.0$), and the interlayer is formed of an $Al_yGa_{1-y}N$ material ($0 \leq y \leq 0.5$).

(5) The method of producing a nitride semiconductor light-emitting device of (4) above, further comprising exposing a portion, on the light-emitting layer side, of the n-contact layer by dry etching, and then growing the $Al_yGa_{1-y}N$ material on the exposed portion of the n-contact layer by MOCVD.

Effect of the Invention

According to the nitride semiconductor light-emitting device in which an interlayer made of an $Al_yGa_{1-y}N$ material ($0 \leq y \leq 0.5$) is provided between an n-contact layer made of an $Al_xGa_{1-x}N$ material ($0.7 \leq x \leq 1.0$) and an n-side electrode, of the present invention, contact resistance between the n-contact layer and the n-side electrode is effectively reduced while maintaining satisfactory external quantum efficiency by preventing UV light generated in a light-emitting layer from being absorbed by the n-contact layer. Further, according to the method of producing a nitride semiconductor light-emitting device of the present invention, it is possible to produce such a nitride semiconductor light-emitting device as described above efficiently.

BEST MODE FOR CARRYING OUT THE INVENTION

Figure 1:
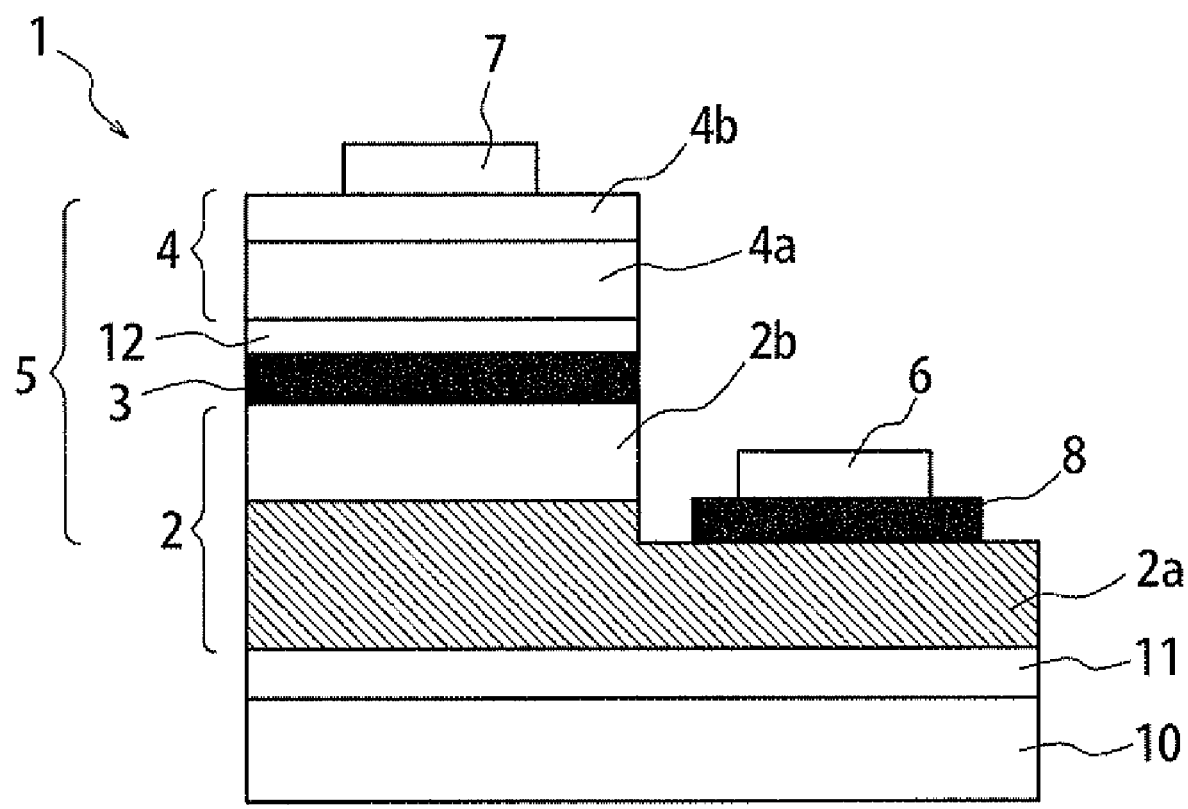
FIG. 1 is a schematic cross-sectional view illustrating a nitride semiconductor light-emitting device according to the present invention.

Next, an embodiment of a nitride semiconductor light-emitting device of the present invention will be described with reference to the accompanying drawings. FIG. 1 schematically shows a cross-sectional structure of a nitride semiconductor light-emitting device according to this invention.

As shown in FIG. 1, a nitride semiconductor light-emitting device 1 of the present invention has a semiconductor laminated body 5 including an n-type laminate 2, a light-emitting layer 3 and a p-type laminate 4, and an n-side electrode 6 and a p-side electrode 7, wherein the n-type laminate 2 includes an n-contact layer 2a made of an $Al_xGa_{1-x}N$ material ($0.7 \leq x \leq 1.0$) and an n-clad layer 2b provided on the n-contact layer 2a; and an interlayer 8 made of an $Al_yGa_{1-y}N$ material ($0 \leq y \leq 0.5$) is provided on a partially exposed portion, on the light-emitting layer 3 side, of the n-contact layer 2a. Due to the aforementioned structure, there are obtained superior effects of effectively reducing contact resistance between the n-contact layer 2a and the n-side electrode 6 while maintaining satisfactory external quantum efficiency by preventing UV light generated in the light-emitting layer 3 from being absorbed by the n-contact layer 2a. In view of the effect of reducing contact resistance, it is more preferable to form the interlayer 8 by an $Al_yGa_{1-y}N$ material ($0 \leq y \leq 0.3$).

Specifically, absorption of UV light generated in the light-emitting layer 3 can be significantly reduced by forming the n-contact layer 2a by an $Al_xGa_{1-x}N$ material ($0.7 \leq x \leq 1.0$), as compared with a case forming the n-contact layer 2a by a material having an Al composition ratio (x) of less than 0.7. However, if the n-side electrode 6 were to be provided directly on such an n-contact layer 2a as described above, contact resistance between the n-contact layer 2a and the n-side electrode 6 would be significantly high, thereby increasing power loss.

In view of this, in the nitride semiconductor light-emitting device 1 of the present invention, contact resistance between the n-contact layer 2a and the n-side electrode 6 is effectively decreased by forming the interlayer 8 by an $Al_yGa_{1-y}N$ material ($0 \leq y \leq 0.5$).

The n-clad layer 2b can be formed, for example, of an $Al_aGa_{1-a}N$ material ($0 \leq a \leq 1$). The light-emitting layer 3 can be formed of, for example, an $Al_bIn_cGa_{1-b-c}N$ material ($0 \leq b \leq 1$, $0 \leq c \leq 1$, $0 \leq b+c \leq 1$). The p-type laminate can be formed of, for example, an $Al_dGa_{1-d}N$ material ($0 \leq d \leq 1$). Mg or the like can be used as a p-type dopant, and Si or the like can be used as an n-type dopant.

Further, thicknesses of the n-contact layer 2a, the n-clad layer 2b, the light-emitting layer 3, the p-clad layer 4a and the p-contact layer 4b, forming the semiconductor laminate body 5, are preferably in the ranges of 1000-5000 nm, 200-500 nm, 20-150 nm, 200-500 nm, and 10-50 nm, respectively. With thicknesses below these ranges, current cannot be diffused sufficiently within the semiconductor layers, while thicknesses larger than these ranges increase the production cost.

The n-side electrode 6 can be formed, for example, as a metal composite film having a Ti-containing film and an Al-containing film formed on the Ti-containing film. Thickness, shape, and size of each of these films of the n-side electrode can be appropriately selected in accordance with the shape and the size of the light-emitting device. Further, the p-side electrode 7 can be formed, for example, as a metal composite film having a Ni-containing film and an Au-containing film formed on the Ni-containing film. Thickness, shape, and size of these films of the p-side electrode can be appropriately selected in accordance with the shape and the size of the light-emitting device.

Further, although not shown in the drawings, it is preferable to provide another (lower) interlayer formed of an $Al_zGa_{1-z}N$ material ($0.5 < z < 0.7$) between the interlayer 8 and the n-contact layer 2a because provision of this layer decreases resistance between the interlayer 8 and the n-contact layer 2a. It is more preferable in structural terms to form the interlayer 8 by an $Al_yGa_{1-y}N$ material ($0 \leq y \leq 0.3$) and the lower interlayer by an $Al_zGa_{1-z}N$ material ($0.3 < z < 0.7$) because then an effect of further reducing contact resistance can be expected.

Thickness of the interlayer 8 is preferably in the range of 20 nm to 200 nm, and more preferably 50 nm to 100 nm. Thickness of the lower interlayer is preferably in the range of 10 nm to 100 nm, and more preferably 20 nm to 50 nm. In a case where these interlayers are made too thin, the interlayer(s) may diffuse and be mixed with the n-contact layer 2a when contact annealing is conducted, failing to function as an interlayer(s). In a case where the interlayers are made too thick, the production cost will rise because it takes longer time for growth thereof accordingly.

The nitride semiconductor light-emitting device 1 of the present invention may have a structure in which the n-contact layer 2a is provided on a sapphire substrate 10 by way of a buffer layer 11 made of an AlN material (thickness: 1000 nm to 1500 nm) interposed therebetween, as shown in FIG. 1.

Further, an electron blocking layer 12 (thickness: 5 nm to 50 nm) may be provided between the light-emitting layer 3 and the p-type laminate 4. The electron blocking layer 12 serves as a barrier against a quantum well layer of the light-emitting layer 3 and prevents electrons from flowing excessively, thereby enhancing carrier injection efficiency. The electron blocking layer 12 may be formed of a p-type $Al_eGa_{1-e}N$ material ($0 \leq e \leq 1$).

A nitride semiconductor light-emitting device 1 described above can effectively decrease contact resistance between the n-contact layer 2a and the n-side electrode 6, while maintaining satisfactory external quantum efficiency by preventing UV light generated in the light-emitting layer 3 from being absorbed by the n-contact layer 2a. The resulting contact resistance between the n-contact layer 2a and the n-side electrode 6 is preferably 10Ω or less and the resulting external quantum efficiency is preferably 0.7% or more.

Figure 2:
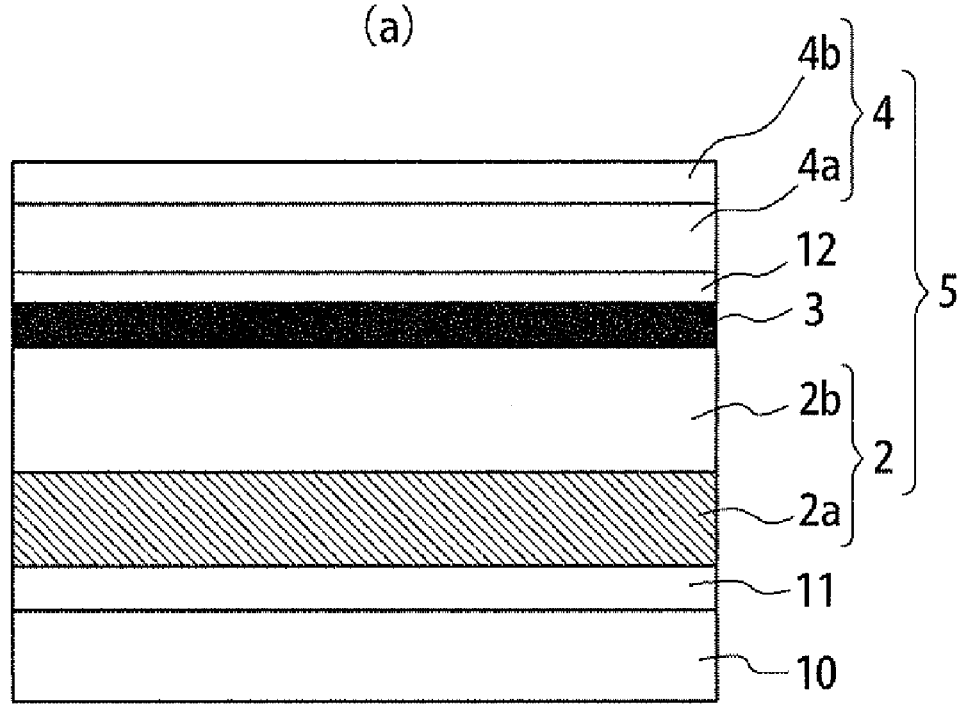
FIGS. 2(a) and 2(b) are schematic cross-sectional views illustrating a process of manufacturing a nitride semiconductor light-emitting device according to the present invention, respectively.
Figure 2:
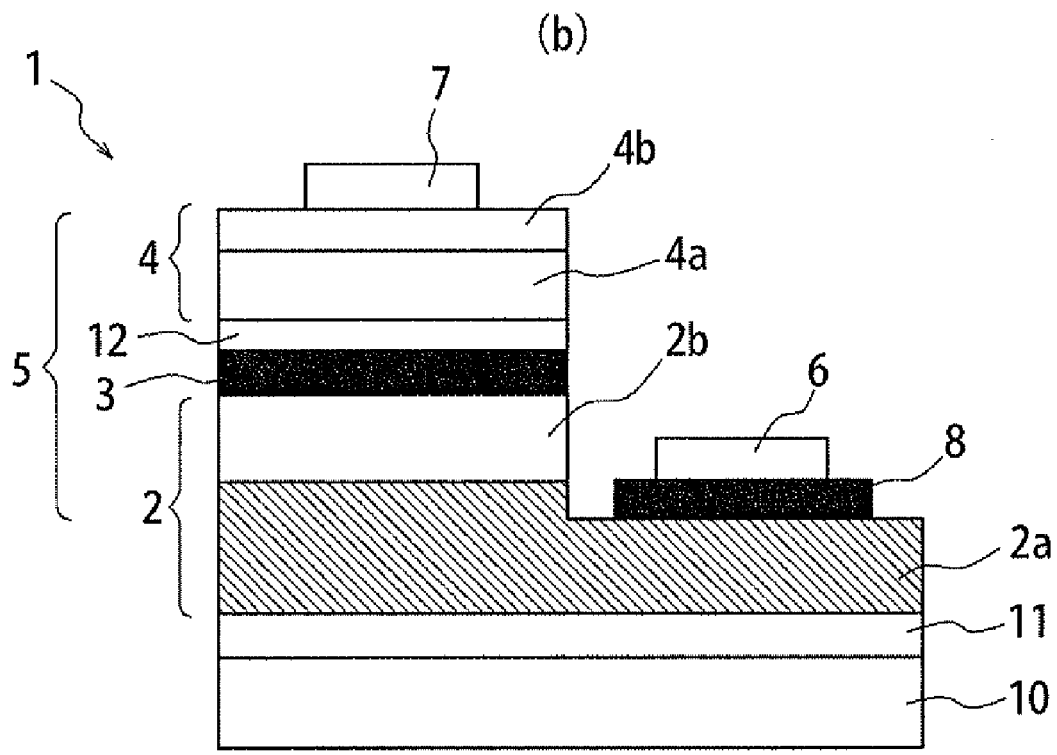

Next, an embodiment of a method of producing a nitride semiconductor light-emitting device 1 of the present invention will be described with reference to the accompanying drawings. FIG. 2(a) and FIG. 2(b) are cross-sectional views illustrating a process of producing a nitride semiconductor light-emitting device 1 according to the present invention.

The method of producing a nitride semiconductor light-emitting device according to the present invention includes the steps of: forming a semiconductor laminated body 5 by sequentially growing on a growth substrate 10 an n-type laminate 2 including an n-contact layer 2a and an n-clad layer 2b, a light-emitting layer 3, and a p-type laminate 4 including a p-clad layer 4a and a p-contact layer 4b in this order, as shown in FIG. 2(a); forming an interlayer 8 and an n-side electrode 6 on the n-contact layer 2a and forming a p-side electrode 7 on the p-contact layer 4b, as shown in FIG. 2(b), wherein the n-contact layer 2a is formed of an $Al_xGa_{1-x}N$ material ($0.7 \leq x \leq 1.0$), and the interlayer 8 is formed of an $Al_yGa_{1-y}N$ material ($0 \leq y \leq 0.5$). Due to the method including the aforementioned steps, there is obtained a superior effect of being capable of efficiently producing the nitride semiconductor light-emitting device 1, which can effectively decrease contact resistance between the n-contact layer 2a and the n-side electrode 6 while maintaining satisfactory external quantum efficiency by preventing UV light generated in the light-emitting layer 3 from being absorbed by the n-contact layer 2a.

The semiconductor laminated body 5 is preferably grown epitaxially on the sapphire substrate 10 using, for example, MOCVD. Use of MOCVD enables layers to be rapidly grown with even thickness.

The interlayer 8 is preferably formed by partially exposing a portion, on the light-emitting layer 3 side, of the n-contact layer 2a by dry etching and thereafter growing an $Al_yGa_{1-y}N$ material ($0 \leq y \leq 0.5$) on the partially exposed portion of the n-contact layer 2a using MOCVD. The $Al_yGa_{1-y}N$ material deposited on portions other than a part where the n-side electrode 6 is to be formed is removed.

The n-side electrode 6 can be formed by successively depositing a Ti-containing film and an Al-containing film thereon by vacuum deposition, for example. After this formation process, the n-side electrode 6 is preferably subjected to a predetermined heat treatment in a nitrogen atmosphere in order to bring the n-side electrode 6, the interlayer 8 and the n-contact layer 2a to ohmic contact therebetween.

The nitride semiconductor light-emitting device 1 according to the present invention can be produced efficiently by using the aforementioned method of producing a nitride semiconductor light-emitting device 1 of the present invention. The present invention can achieve particularly high light output power when it is applied to a UV light-emitting device having an emission wavelength of 300 nm or less because UV light generated in a light-emitting layer is then less likely to be absorbed by the n-contact layer.

The foregoing descriptions merely illustrate some examples of embodiments of the present invention and various modifications can be made thereto in the scope of accompanying claims.

EXAMPLES

Evaluation of Resistance Properties and Ohmic Properties

Figure 3:
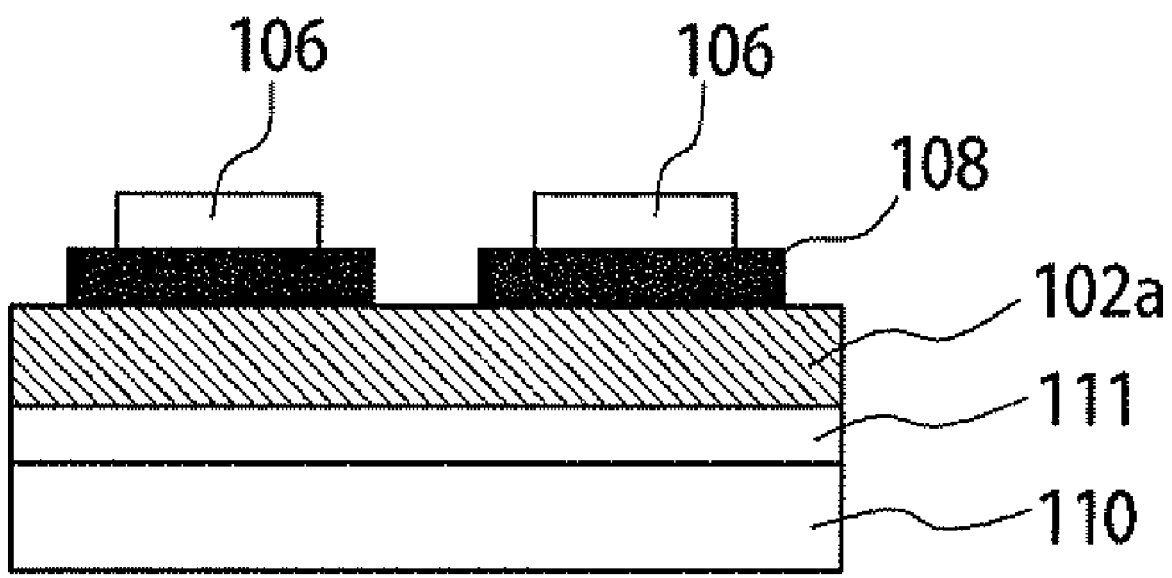
FIG. 3 is a schematic cross-sectional view illustrating a sample structure for evaluating ohmic properties.

As shown in FIG. 3, a buffer layer 111 (AlN material: 1 μm), an n-contact layer 102a (Si-doped $Al_{0.7}Ga_{0.3}N$ material: 2 μm), and a specific interlayer 108 ($Al_yGa_{1-y}N$ materials of three different composition ratios, i.e. y=0, 0.3, 0.7) were epitaxially grown by MOCVD on a sapphire substrate 110. An n-side electrodes 106 (Ti/Al=20 nm/200 nm) were then formed thereon by vacuum deposition. The interlayer 108 was formed to be 300 μm×300 μm squares, and the n-side electrodes 106 were formed to be 200 μm×200 μm squares. Intervals between adjacent squares of the interlayer 108 were set to be 100 p.m. The Al composition ratios (%) and the resistance values (Ω) of the interlayers 108 of Samples 1 to 3 thus formed are shown in Table 1. The resistance values were obtained from the voltage at electric current of 1 mA.

TABLE 1

|  | Al composition ratio (%) | Resistance value (Ω) |
| --- | --- | --- |
| Sample 1 | 0 | 12 |
| Sample 2 | 30 | 9 |
| Sample 3 | 70 | 3000 |

As shown in Table 1, Samples 1 and 2, each having a relatively small Al composition ratio ($y \leq 0.3$) in the $Al_yGa_{1-y}N$ material constituting the interlayer 108, exhibit significantly small (not larger than one hundredth) contact resistance values, respectively, as compared with Sample 3 having a relatively large Al composition ratio.

Figure 4:
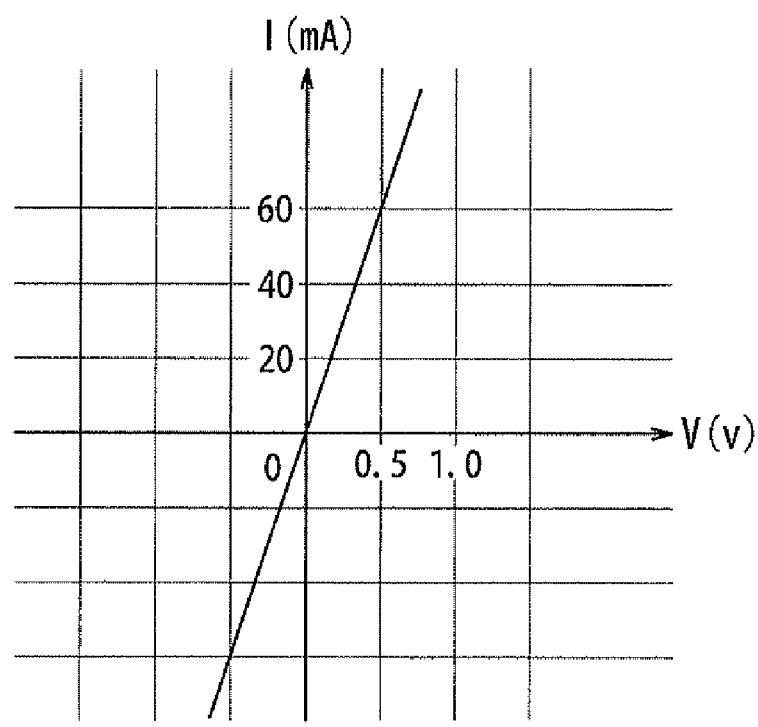
FIGS. 4(a) and 4(b) are graphs illustrating current-voltage characteristics of Samples, respectively.
Figure 4:
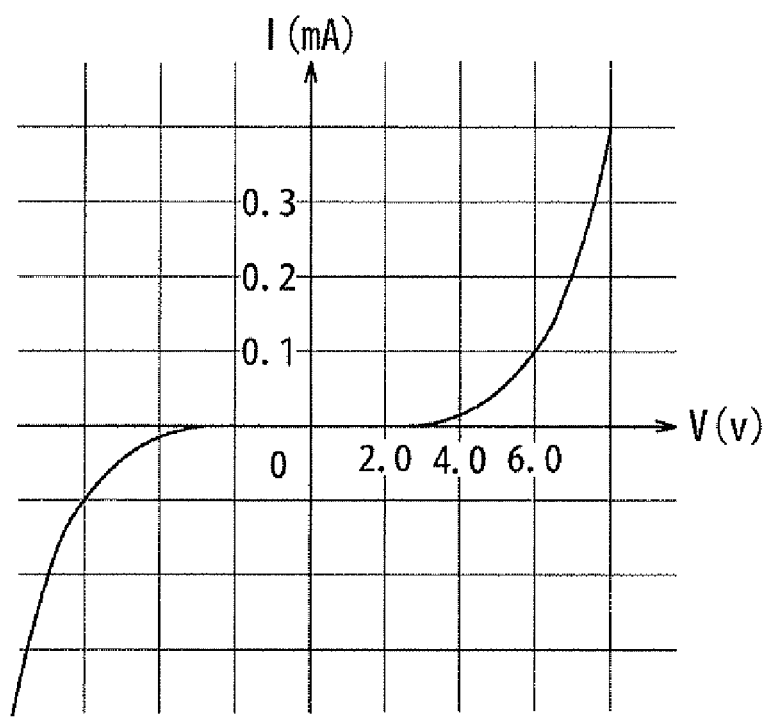

Further, current-voltage characteristics were measured for these samples by using a curve tracer. FIG. 4(a) and FIG. 4(b) are graphs illustrating measurement results of Sample 2 and Sample 3, respectively. The X axis represents voltage and the Y-axis represents current. As shown in FIG. 4(a), the current-voltage characteristics of Sample 2 having Al composition ratio of 30% are plotted as a straight line, indicating that ohmic contacts had been achieved. In contrast, the current-voltage characteristics of Sample 3 having Al composition ratio of 70% are plotted as a curve as shown in FIG. 4(b), indicating the presence of Schottky contact.

In general, it is desirable that resistance of a light-emitting device is 1 kΩ or less and the current-voltage characteristics thereof are plotted in a straight line. It is understood from the results shown in Table 1, FIG. 4(a) and FIG. 4(b) that good ohmic contact can be obtained and resistance can be greatly reduced when Al composition ratio of the interlayer is in the range of 0% to 50% as specified in the present invention.

External Quantum Efficiency Characteristic

Example 1

A buffer layer 11 (AlN material: 1 μm), an n-contact layer 2a (Si-doped $Al_{0.7}Ga_{0.3}N$ material: 2 μm), an n-clad layer 2b (Si-doped $Al_{0.65}Ga_{0.35}N$ material: 500 nm), a light-emitting layer 3 ($Al_{0.55}In_{0.01}Ga_{0.44}N$ material (10 nm)/ $Al_{0.06}In_{0.01}Ga_{0.39}N$ material (15 nm) of three-layer multi-quantum-well structure, total thickness of 90 nm), an electron blocking layer 12 (Mg-doped $Al_{0.9}Ga_{0.1}N$ material: 20 nm), a p-clad layer 4a (Mg-doped $Al_{0.7}Ga_{0.3}N$ material: 200 nm), and a p-contact layer 4b (Mg-doped GaN material: 20 nm) were epitaxially grown in this order successively on a sapphire substrate 10 by MOCVD, as shown in FIG. 1. A portion of the n-contact layer 2a was partially exposed by dry etching. An interlayer 8 ($Al_{0.3}Ga_{0.7}N$ materials: 50 nm) was epitaxially grown on the exposed portion of the n-contact layer 2 by MOCVD. The interlayer 8 was then removed except for a portion on which the n-side electrode 6 was to be formed. An n-side electrode 6 (Ti/Al) was formed on the remained interlayer 8, and a p-side electrode 7 (Ni/Au) was formed on the p-contact layer 4b. Thereafter, heat treatment was carried out in nitrogen atmosphere, so that the n-side electrode 6 and the n-contact layer 2a were brought into ohmic contact, whereby the nitride semiconductor light-emitting device 1 of Example 1 according to the present invention was formed.

Example 2

A nitride semiconductor light-emitting device 1 of Example 2 was formed by the same method as Example 1, except that a lower interlayer ($Al_{0.7}Ga_{0.3}N$ material: 500 nm) was formed between the n-contact layer 2a and the interlayer 8 in the former.

Comparative Example 1

Figure 5:
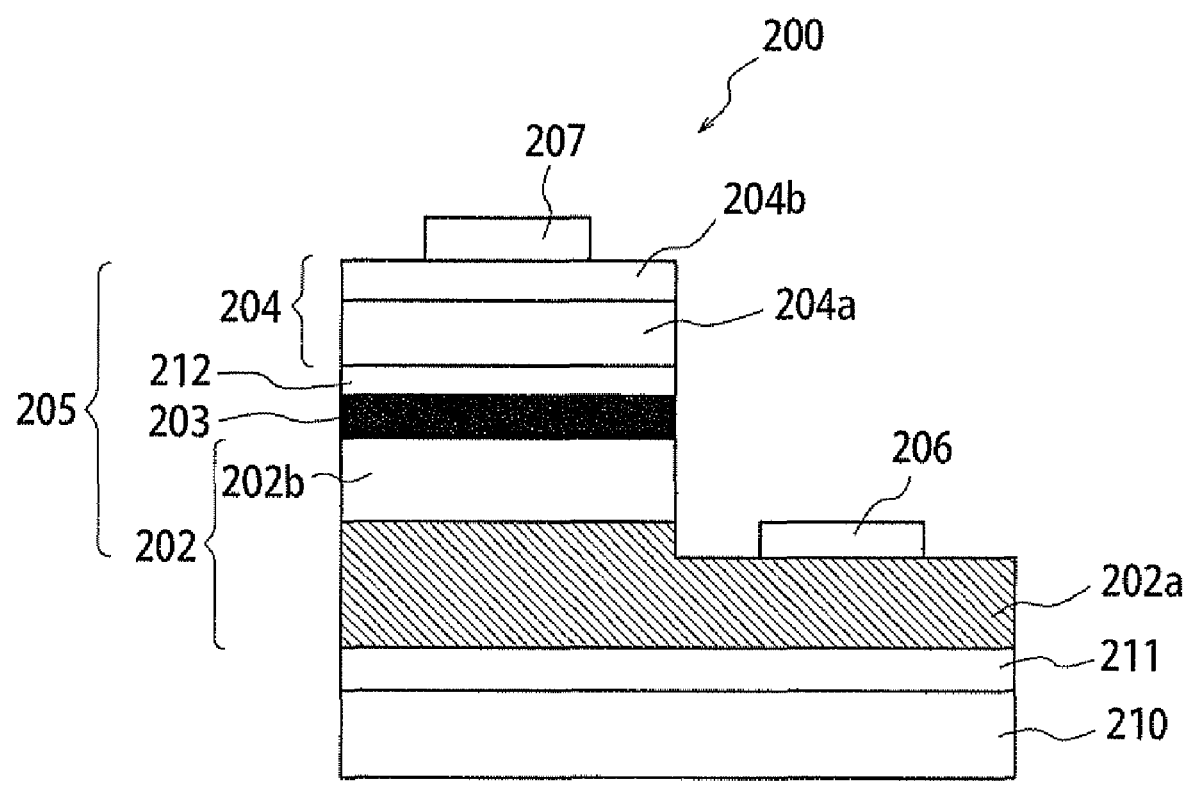
FIG. 5 is a schematic cross-sectional view illustrating a conventional nitride semiconductor light-emitting device.

A nitride semiconductor light-emitting device 200 of Comparative Example 1 was formed by the same method as Example 1, except that the interlayer 8 was not formed in the former, as shown in FIG. 5.

Comparative Example 2

A nitride semiconductor light-emitting device 200 of Comparative Example 2 was formed by the same method as Comparative Example 1, except that the n-contact layer 202a was formed by a Si-doped $Al_{0.3}Ga_{0.7}N$ material in the former.

Each of the nitride semiconductor light-emitting devices thus formed was assembled into a flip-chip package. Voltage Vf (V) and light output power Po (mW) at electric current of 20 mA were measured, respectively, using an integrating sphere. The measurement results, as well as the values of external quantum efficiency calculated from the formula below, are shown in Table 2.

External quantum efficiency $\eta = \{Po \times \lambda(nm)\}/\{I_f(mA) \times 1239.8\}$ ($\lambda = 265$ nm, $I_f = 20$ mA)

TABLE 2

| | Voltage $V_f$ (V) | Light output power Po (mW) | External quantum efficiency (%) |
|---|---|---|---|
| Example 1 | 11.14 | 0.71 | 0.76 |
| Example 2 | 10.40 | 0.76 | 0.81 |
| Comparative Example 1 | 14.85 | 0.54 | 0.58 |
| Comparative Example 2 | 11.73 | 0.45 | 0.48 |

As shown in table 2, Comparative Example 1, lacking an interlayer and having a relatively large Al composition ratio of the n-contact layer, has higher contact resistance between the n-contact layer and the n-side electrode and thus exhibits higher voltage than Examples 1 and 2, and Comparative Example 2. Further, Comparative Example 2, lacking an interlayer and having a relatively small Al composition ratio of the n-contact layer, exhibits relatively low external quantum efficiency due to high amount of absorbed UV light, although voltage drops due to relatively small contact resistance between the n-contact layer and the n-side electrode. In contrast, it is understood that Examples 1 and 2 can each achieve reduction in contact resistance and improvement in external quantum efficiency in a compatible manner.

INDUSTRIAL APPLICABILITY

According to the nitride semiconductor light-emitting device in which an interlayer made of an $Al_yGa_{1-y}N$ material ($0 \leq y \leq 0.5$) is provided between an n-contact layer made of an $Al_xGa_{1-x}N$ material ($0.7 \leq x \leq 0.1$) and an n-side electrode, of the present invention, contact resistance between the n-contact layer and the n-side electrode is effectively reduced while maintaining satisfactory external quantum efficiency by preventing UV light generated in a light-emitting layer from being absorbed by the n-contact layer. Further, according to the method of producing a nitride semiconductor light-emitting device of the present invention, it is possible to produce such nitride semiconductor light-emitting device as described above efficiently.

EXPLANATION OF REFERENCE NUMERALS

| | Explanation of Reference Numerals |
|---|---|
| 1 | Nitride semiconductor light-emitting device |
| 2 | N-type laminate |
| 2a | N-contact layer |
| 2n | N-clad layer |
| 3 | Light-emitting layer |
| 4 | P-type laminate |
| 4a | P-clad layer |
| 4b | P-contact layer |
| 5 | Semiconductor laminated body |
| 6 | N-side electrode |
| 7 | P-side electrode |
| 8 | Interlayer |
| 10 | Substrate |
| 11 | Buffer layer |
| 12 | Electron blocking layer |
| 102a | N-contact layer |
| 106 | N-side electrode |
| 108 | Interlayer |
| 110 | Sapphire substrate |
| 111 | Buffer layer. |

The invention claimed is:

1. A nitride semiconductor light-emitting device having a semiconductor laminated body including an n-type laminate, a light-emitting layer and a p-type laminate, and an n-side electrode and a p-side electrode, wherein:
   the n-type laminate includes an n-contact layer made of an $Al_xGa_{1-x}N$ material, such that $0.7 \leq x \leq 1.0$ and an n-clad layer provided on the n-contact layer; and
   an interlayer made of an $Al_yGa_{1-y}N$ material, such that $0 \leq y \leq 0.5$, is provided on a partially exposed portion, on the light-emitting layer side, of the n-contact layer.

2. The nitride semiconductor light-emitting device of claim 1, further comprising an electron blocking layer between the light-emitting layer and the p-type laminate.

3. The nitride semiconductor light-emitting device of claim 2, wherein the resistance between the n-contact layer and the n-side electrode is equal to or less than 10Ω, and the external quantum efficiency is equal to or higher than 0.70%.

4. The nitride semiconductor light-emitting device of claim 1, wherein the resistance between the n-contact layer and the n-side electrode is equal to or less than 10Ω, and the external quantum efficiency is equal to or higher than 0.70%.

5. A method of producing a nitride semiconductor light-emitting device, comprising the steps of:
   forming a semiconductor laminated body by sequentially growing on a substrate an n-type laminate including an n-contact layer and an n-clad layer, a light-emitting layer, and a p-type laminate including a p-clad layer and a p-contact layer in this order;
   forming an interlayer and an n-side electrode on the n-contact layer; and
   forming a p-side electrode on the p-contact layer,
   wherein the n-contact layer is formed of an $Al_xGa_{1-x}N$ material such that $0.7 \leq x \leq 1.0$, and the interlayer is formed of an $Al_yGa_{1-y}N$ material such that $0 \leq y \leq 0.5$.

6. The method of producing a nitride semiconductor light-emitting device of claim 5, further comprising exposing a portion, on the light-emitting layer side, of the n-contact layer by dry etching, and then growing the $Al_yGa_{1-y}N$ material on the exposed portion of the n-contact layer by MOCVD.

* * * * *